(12) United States Patent
Kao et al.

(10) Patent No.: US 7,704,778 B2
(45) Date of Patent: Apr. 27, 2010

(54) MICROLENS STRUCTURE FOR IMAGE SENSORS

(75) Inventors: Ming-Chang Kao, Bali Township (TW); Chih-Kung Chang, Hsin-Chu (TW); Fu-Tien Weng, Hsin-Chu (TW); Bii-Junq Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1281 days.

(21) Appl. No.: 11/181,508

(22) Filed: Jul. 14, 2005

(65) Prior Publication Data

US 2006/0189024 A1 Aug. 24, 2006

Related U.S. Application Data

(60) Provisional application No. 60/655,489, filed on Feb. 23, 2005.

(51) Int. Cl.
*H01L 21/00* (2006.01)

(52) U.S. Cl. .......................................... 438/69; 430/351

(58) Field of Classification Search ................ None
See application file for complete search history.

(56) References Cited

U.S. PATENT DOCUMENTS

| | | | |
|---|---|---|---|
| 6,236,434 B1 | 5/2001 | Yamada | |
| 6,350,127 B1 | 2/2002 | Chiang et al. | |
| 6,441,412 B2 | 8/2002 | Oh et al. | |
| 6,514,785 B1 | 2/2003 | Chiang et al. | |
| 6,638,786 B2 | 10/2003 | Yamamoto | |
| 6,717,190 B2 | 4/2004 | Shizukuishi | |
| 6,818,934 B1 | 11/2004 | Yamamoto | |
| 2004/0121246 A1 * | 6/2004 | Brown | 430/5 |
| 2005/0058947 A1 * | 3/2005 | Rinehart et al. | 430/321 |
| 2006/0023314 A1 * | 2/2006 | Boettiger et al. | 359/621 |
| 2006/0119950 A1 * | 6/2006 | Boettiger et al. | 359/626 |

FOREIGN PATENT DOCUMENTS

| | | |
|---|---|---|
| CN | 1472818 | 2/2004 |
| CN | 1501507 | 6/2004 |

OTHER PUBLICATIONS

Fossum, E.R., "CMOS Image Sensors: Electronic Camera-On-A-Chip," IEEE Transactions on Electron Devices, vol. 44, No. 10 (Oct. 1997) pp. 1689-1698.
Rhodes, H., et al., "CMOS Imager Technology Shrinks and Image Performance," IEEE (2004) pp. 7-18.
Wuu, S.-G., et al., "High Performance 0.25-um CMOS Color Imager Technology with Non-silicide Source/Drain Pixel," IEDM (2000) pp. 705-708.

* cited by examiner

*Primary Examiner*—Mark F Huff
*Assistant Examiner*—Anna L Verderame
(74) *Attorney, Agent, or Firm*—Slater & Matsil, L.L.P.

(57) ABSTRACT

A microlens structure and a method of fabrication thereof are provided. The method comprises forming a layer of microlens material over a substrate, which has photo-sensitive elements formed therein. The microlens material, which comprises a photo-resist material, is exposed in accordance with a desired pattern a plurality of times. The energy used with each exposure process is less than the energy required if a single exposure is used. Furthermore, the masks used for each exposure may differ. In an embodiment, the masks are varied so as to create a notch in the upper corner of the microlens.

22 Claims, 5 Drawing Sheets

MICROLENS STRUCTURE FOR IMAGE SENSORS

This application claims the benefit of U.S. Provisional Application No. 60/655,489 filed on Feb. 23, 2005, entitled Microlens for Image Sensors, which application is hereby incorporated herein by reference.

TECHNICAL FIELD

The present invention relates generally to semiconductor structures, and more particularly, to microlenses for use with image sensors.

BACKGROUND

Digital imaging systems such as digital cameras utilize semiconductor chips equipped with photo-sensitive electronic components, such as photo-diodes. The digital imaging systems typically capture light information in a series of pixels. Commonly, the pixels are arranged in an array of rows and columns, such as 1024×768 pixels. Each pixel is represented by at least one photo-sensitive component. In applications requiring the capture of color, color filters may be used to capture the specific colors of the received light, and each pixel may be represented by more than one photo-sensitive component.

Generally, a microlens guides the light to the photo-sensitive component, essentially acting as the collection point for the digital imaging system. A microlens is a tiny lens formed on a semiconductor chip above a photo-sensitive component. Because the collected light passes through the microlens, it is important that the microlens be shaped such that it accurately guides light to the photo-sensitive component.

Microlenses are generally formed by applying a layer of microlens material on a semiconductor chip. The microlens material, which is typically a photo-resist material, is exposed in accordance with a desired pattern and developed to remove unwanted microlens material. After the microlenses have been patterned, a reflow process is performed to cause the microlenses to form a substantially uniform symmetrical lens shape.

Problems, however, may be incurred during the fabrication of the microlenses as the design sizes are reduced. For example, as the design size is reduced, the microlenses are positioned closer together. As the microlenses are positioned closer together, the microlenses have a tendency to merge during the reflow procedure. The reflow procedure, which uses high temperatures, is difficult to control and, thus, it is difficult to prevent the microlenses from merging as the distance between microlenses decreases.

Another problem often seen is related to the focal length. Many times the thickness of the device will increase due to, among other things, additional layers (e.g., metal layers) as more circuitry is integrated onto a single chip. The additional layers in turn increase the focal length, which requires a thinner microlens. The reflow procedure to create thinner microlenses generally uses a higher temperature, which further increases the possibility of the microlenses merging.

Therefore, there is a need for a method for fabricating microlenses to reduce the critical dimension between microlenses and to reduce the thickness of the microlenses.

SUMMARY OF THE INVENTION

These and other problems are generally solved or circumvented, and technical advantages are generally achieved, by preferred embodiments of the present invention which provides a microlens structure for use with an image sensor, and a method of fabricating a microlens.

In accordance with an embodiment of the present invention, a first method of forming a microlens is provided. The method comprises providing a substrate having one or more photo-sensitive elements formed thereon. A photo-sensitive layer is formed over the substrate. Thereafter, a first exposure and a second exposure in accordance with a mask are performed such that remaining portions of the photo-sensitive layer form one or more microlenses. A reflow procedure may then be performed.

In accordance with another embodiment of the present invention, a second method of forming a microlens is provided. The method comprises providing a substrate having one or more photo-sensitive elements formed thereon. A photo-sensitive layer is formed over the substrate and a plurality of exposures are performed. A portion of the photo-sensitive layer is removed to define a plurality of microlenses. A reflow procedure may then be performed.

In accordance with an embodiment of the present invention, a method of forming an image sensing semiconductor device is provided. The method comprises providing a substrate having an image sensing portion and a logic portion, the image sensing portion having a plurality of photo-sensitive devices formed thereon and the logic portion having one or more interconnection layers. A photo-sensitive layer is formed over the image sensing portion and a plurality of exposures are performed in accordance with a mask, the exposures exposing at least a portion of the photo-sensitive layer. At least a portion of the photo-sensitive layer exposed during the exposures is removed and the remaining portions of the photo-sensitive layer form one or more microlenses. Thereafter, the microlenses are reflowed.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
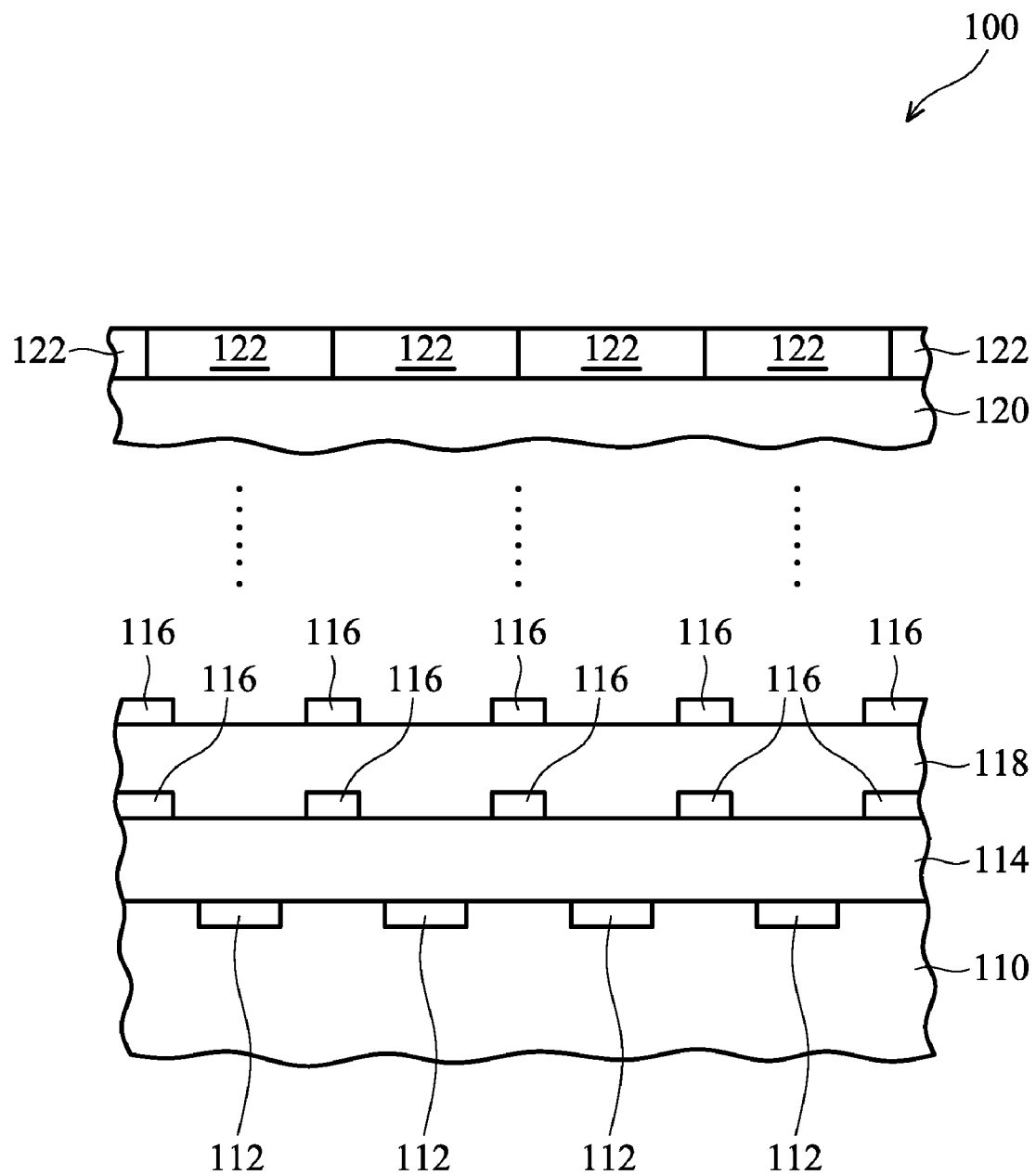
FIGS. 1-4 are cross-section views of a wafer after various process steps have been performed to fabricate a microlens in accordance with an embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention are described in the context of a CMOS image sensor, which is one application of the present invention that has been found to be particularly useful. Embodiments of the present invention, however, may be used to form microlenses for other types of devices, including charged-coupled device (CCD) image sensors.

FIGS. 1-4 illustrate cross-section views of a wafer 100 during various steps of a method of fabricating microlenses in accordance with an embodiment of the present invention. The process begins in FIG. 1, wherein the wafer 100 has been prepared in accordance with standard processing techniques known in the art. Generally, the wafer 100 comprises a substrate 110 having photo-sensitive devices 112 formed therein. The photo-sensitive devices 112 may comprise, for example, photo-diodes formed by implanting impurities via an ion implant to form, for example, a PN junction photo-diode, a PNP photo-transistor, an NPN photo-transistor, or the like. The photo-sensitive devices 112 may also comprise a photo-gate device or other light sensitive elements.

An inter-layer dielectric (ILD) layer 114 is typically formed over the substrate 110. It should be noted that other circuitry (not shown), such as transistors, capacitors, or the like, may also be formed on the substrate 110. In a typical embodiment, the ILD forms a planarized layer over the other circuitry upon which other layers (e.g., metal interconnect layers) may be formed. It should also be noted that other structures (not shown) may be formed in the substrate 110. For example, it is common for isolation structures, such as field oxide regions or shallow trench isolation (STI) structures to separate the photo-sensitive devices 112 from each other and to separate the photo-sensitive devices 112 from other circuitry (not shown).

In an embodiment, the ILD layer 114 may be formed, for example, of a low-K dielectric material, such as silicon oxide, borophosphosilicate glass (BPSG), phosphosilicate glass (PSG), fluorinated silicate glass (FSG), carbon-doped silicon oxide, or the like, by any suitable method known in the art. In an embodiment, the ILD layer 114 comprises BPSG or PSG that may be formed by chemical vapor deposition (CVD) techniques to a thickness from about 2000 Å to about 8000 Å. Other thicknesses and materials may be used.

One or more interconnect layers 116 with an inter-metal dielectric (IMD) layer 118 interposed between the interconnect layers 116 may be formed over the ILD layer 114. The interconnect layers 116 can be patterned by plasma etching or a damascene process and may be formed of any conductive material suitable for the particular application. Materials that may be suitable include, for example, aluminum, copper, doped polysilicon, or the like. Contacts and/or vias (not shown) may be formed to provide electrical connectivity between the interconnect layers and underlying circuitry and/or between metal layers.

It should be noted that embodiments of the present invention may be particularly useful in embodiments utilizing a greater number of interconnect layers 116, such as three or more metal layers in which the total thickness of the dielectric material between the microlenses (see FIG. 2) and the photo-sensitive devices is greater than about 3.5 um. It is expected that the total thickness of the dielectric materials between the microlenses and the photo-sensitive devices is greater than about 3.5 um, 4.5 um, 5.0 um, and 6.0 um when fabricating devices having 3, 4, 5, and 6 interconnect layers, respectively. In these embodiments, a thinner mircrolens having a longer focal length is desired. As discussed in greater detail below, embodiments of the present invention may be used to fabricate thinner microlenses having a longer focal length with a reduced risk of the microlenses merging.

One or more passivation layers 120 may be formed over the upper-most interconnect layer. In an embodiment, the passivation layer may comprise an oxide layer and/or a nitride layer formed by CVD techniques as are known in the art. The passivation layers 120 protect the underlying circuitry from the environment and provide a substantially planarized layer upon which one or more optional color filters 122 may be formed.

The optional color filters 122 may be used to allow specific wavelengths of light to pass while reflecting other wavelengths, thereby allowing the image sensor to determine the color of the light being received by the photo-sensitive devices 112. The color filters 122 may vary, such as a red, green, and blue filter. Other combinations, such as cyan, yellow, and magenta, may also be used. The number of different colors of the color filters 122 may also vary.

In an embodiment, the color filters 122 comprise a pigmented or dyed material, such as an acrylic. For example, polymethyl-methacrylate (PMMA) or polyglycidyl-methacrylate (PGMS) are suitable materials with which a pigment or dye may be added to form the color filters 122. Other materials, however, may be used. The color filters 122 may be formed by any suitable method known in the art.

Figure 2:
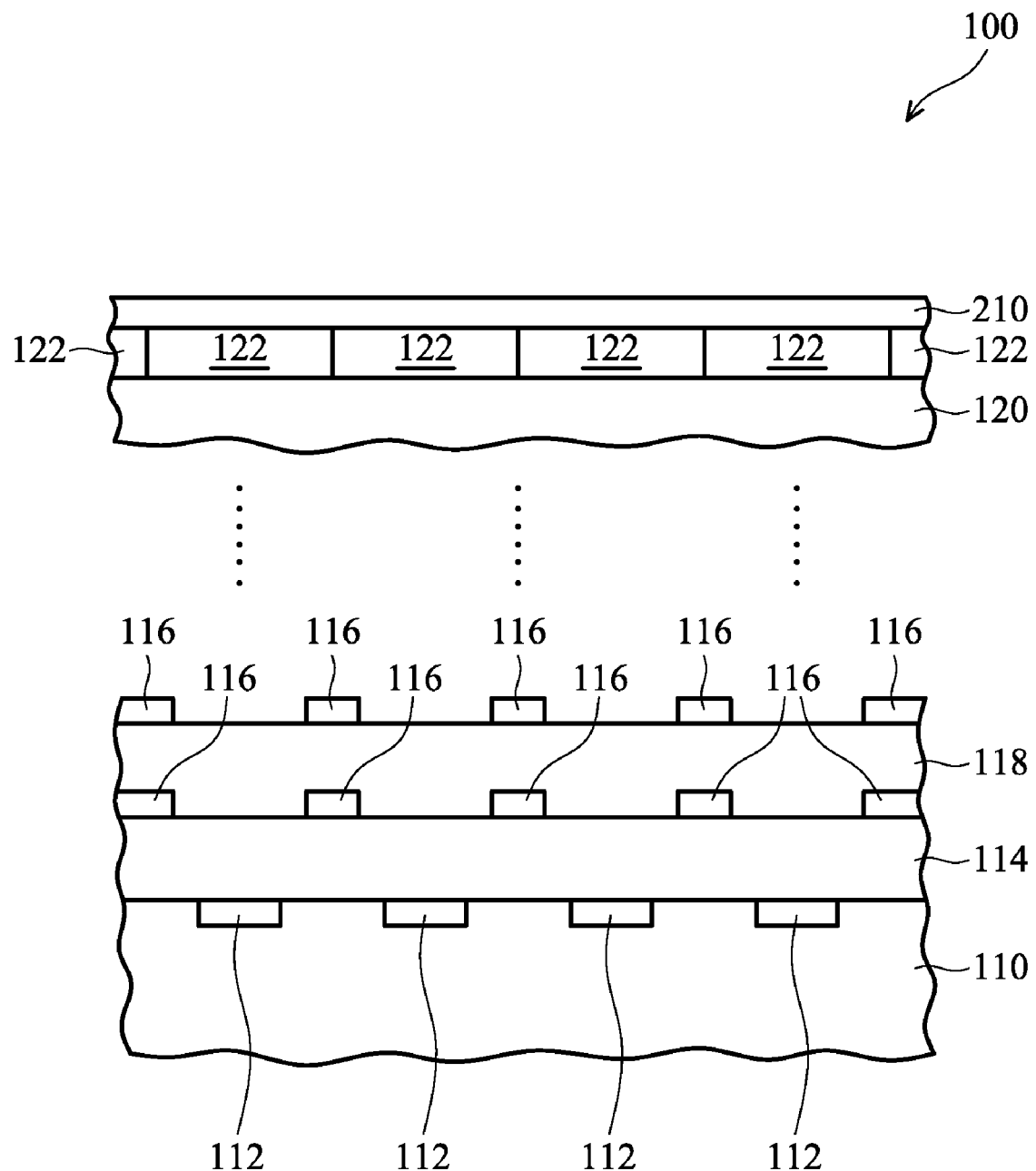

FIG. 2 is a cross-section view of the wafer 100 illustrated in FIG. 1 after a microlens layer 210 has been applied in accordance with an embodiment of the present invention. Preferably, the microlens layer 210 is about 0.1 um to about 2.5 um in thickness, but preferably is from about 0.1 um to about 0.5 um in thickness.

The microlens layer 210 may be formed of any material that may be patterned and formed into lenses, such as a high transmittance, acrylic polymer. It is preferred, however, that the microlens layer 210 be formed of a positive photoresist material. Positive photoresist material may be patterned by exposing the photoresist material in accordance with a desired pattern such that the unwanted photoresist material is exposed and developing the photoresist material to remove the unwanted portions. Suitable materials that may be used in accordance with the present invention include, for example, polymethylmethacrylate (PMMA), polyglycidylmethacrylate (PGMA), a mixture of ethyl lactate and propyleneglycol monoether ether acetate, a mixture of propyleneglycol ether acetate and phenolic resin, or the like. Examples of such materials include MFR 380 series and MFR344 series, manufactured by JSR Corporation of Tokyo, Japan.

In an embodiment, the microlens layer 210 may be formed using a material in a liquid state and spin-on techniques known in the art. This method has been found to produce a substantially planar surface and a microlens layer 210 having a substantially uniform thickness, thereby providing greater uniformity in the microlenses. Other methods, such as deposition techniques like chemical vapor deposition (CVD), physical vapor deposition (PVD), or the like, may also be used.

Figure 3:
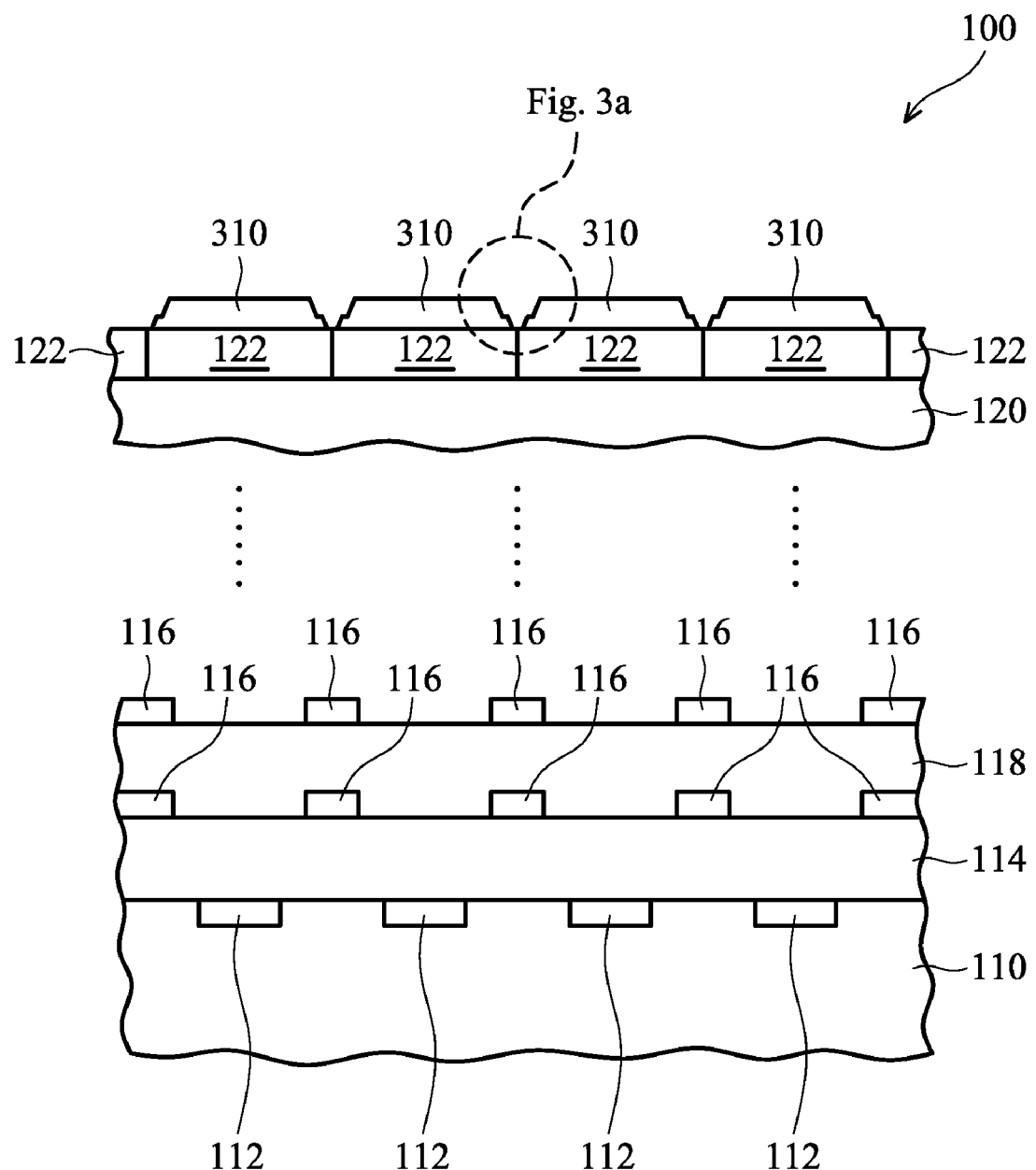

Referring now to FIG. 3, a cross-section view of the wafer 100 illustrated in FIG. 2 after the microlens layer 210 (FIG. 2) has been patterned to form microlenses 310 in accordance with an embodiment of the present invention is shown. In this embodiment in which the microlenses 310 are formed of a positive photoresist material, the microlenses 310 may be patterned using an i-line stepper such that the mask contains opaque areas where the microlenses are to be located, thereby protecting the microlenses 310 from being exposed and removed during developing. In a preferred embodiment, the wafer moves in a substantially parallel plane to the mask, as is known in the art.

In accordance with an embodiment of the present invention, the exposure of the photoresist material is performed in a plurality of steps. It has been found that using a single exposure requires a higher energy level and that the higher energy level may cause a wider exposure area. Accordingly, it is preferred that a plurality of exposures be used, wherein the energy used for each exposure is reduced. The reduced energy levels allow a smaller critical dimension (CD) to be formed, thereby allowing the microlenses to be formed closer together.

Figure 3A:
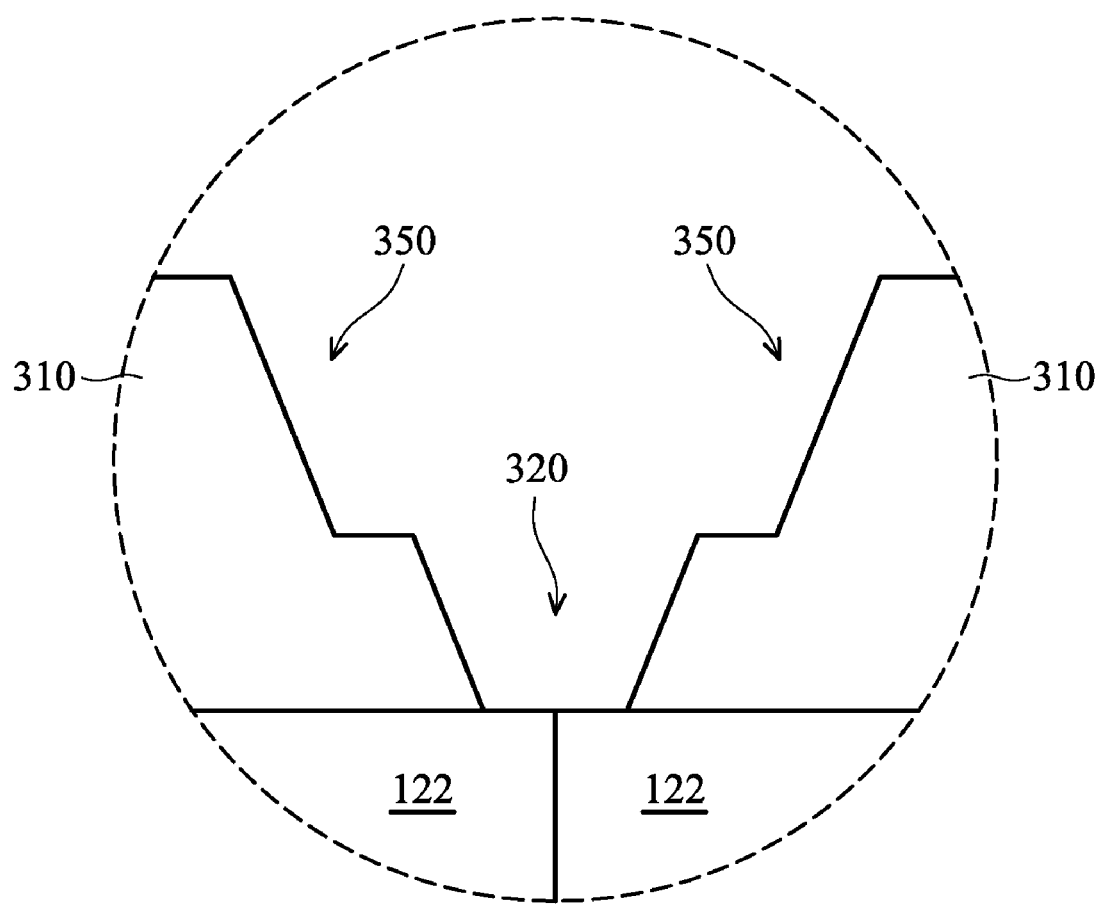

It should be noted that the mask used for each of the exposures to pattern the microlenses 310 may have a different focal plane. The energy used for each of the plurality of exposures may be varied dependent upon the particular shape desired by the specific application being fabricated. In an embodiment, a single mask is used with multiple exposures to achieve the edge profile of the microlenses as illustrated in FIG. 3a, wherein each of the exposures uses a different focal plane. In this case, the focal plane of the first exposure is in the lower part 320 of the microlenses 310 and the focal plane of the second exposure is in the upper part 350 of the microlenses 310.

The amount of energy used for each exposure is preferably between about 0.7 and 1.0 of the total amount of energy typically required to expose the complete thickness of the microlenses 310, divided by the number of exposures to be performed. For example, if a particular layer typically requires 240 mj to expose the microlens layer, then in accordance with an embodiment of the present invention, two exposures of about 84 mj (0.7*240/2) to about 120 mj (1.0*240/2) may be used. The lower energy levels will allow a smaller CD to be patterned between microlenses 310. As another example, three exposures of about 56 mj (0.7*240/3) to about 80 mj (1.0*240/3) may also be used, which may further reduce the CD between microlenses 310. Thicker microlens layers may require a higher ratio, e.g., about 1.0, while thinner microlens layers may require a lower ratio, e.g., about 0.7.

The amount of each exposure does not necessarily need to be apportioned equally. For example, it may be desirable to create a notch having a depth greater than half the thickness of the microlenses 310. In this embodiment, assuming as above that an exposure of 240 mj is sufficient to expose and develop the entire thickness of the microlenses 310, a first exposure may use 80 mj and a second exposure may use 160 mj. Because the second exposure forms the notch area, some over exposure is not as detrimental and does not necessarily affect the CD between the microlenses 310.

Figure 4:
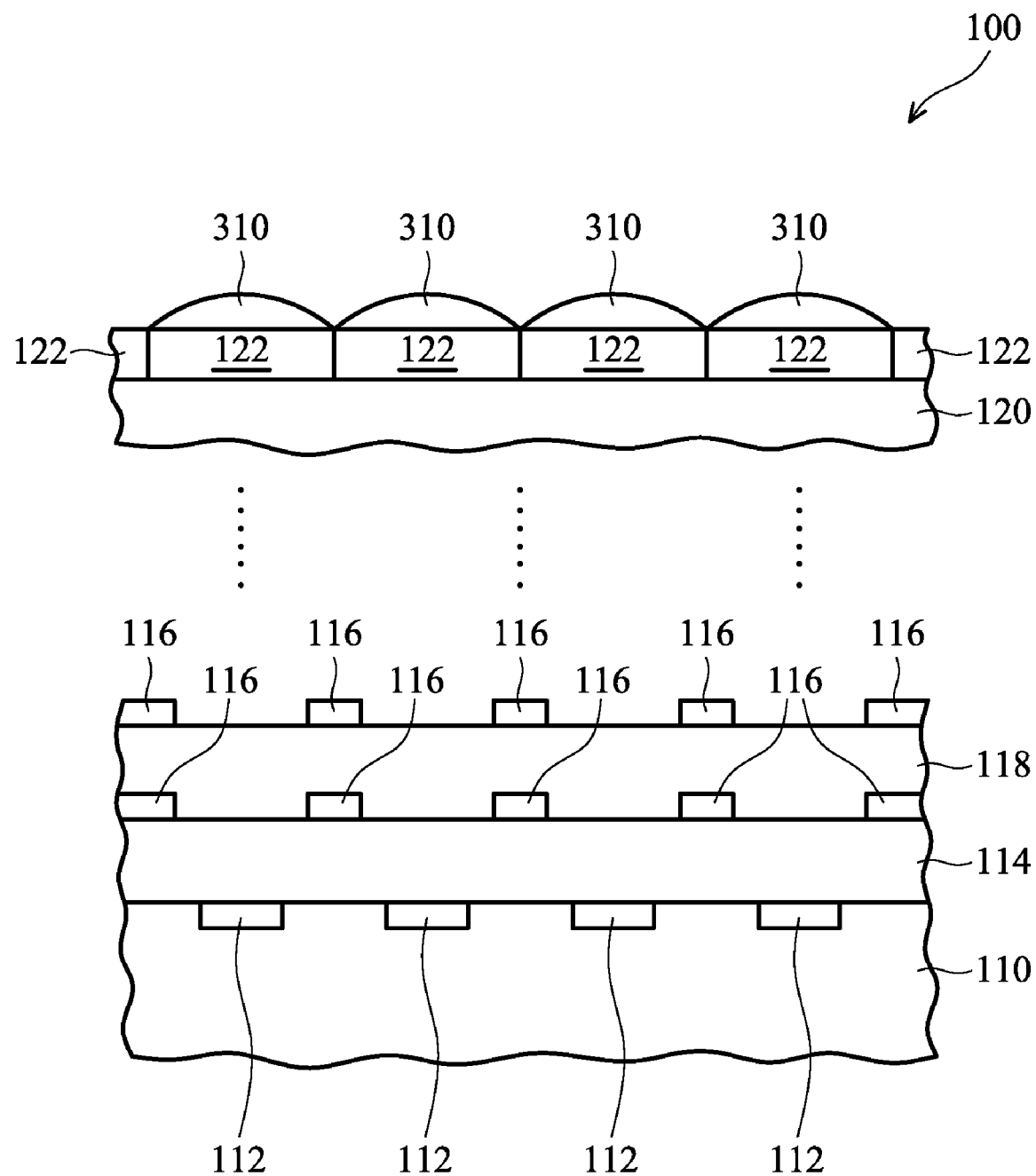

FIG. 4 illustrates a cross-section view of the wafer 100 illustrated in FIG. 3 after a reflow process has been performed to shape the microlenses 310 in accordance with an embodiment of the present invention. The reflow process may comprise heating the microlenses 310 to a temperature sufficient to cause the microlenses 310 to adopt a substantially hemispherical shape. The reflow process is preferably a thermal process performed at a temperature between about 100° C. and about 200° C. for about 10 seconds to about 30 minutes. After reflow, the gap between microlenses is preferably less than about 0.2 um, but more preferably less than about 0.1 um to improve the quantum efficiency.

An optional bleaching process may be performed prior to the reflow process. Generally, the bleaching process reduces the amount of photoactive material from the microlenses. Reduction of the photoactive material reduces degradation of the microlenses due to exposure to the higher temperatures of the reflow process and improves transmissivity. The bleaching process may be performed by exposing the microlenses 310 to ultra-violet (UV) radiation.

As a result of the reflow process, microlenses 310 are shaped as illustrated in FIG. 4. The height of the microlenses 310 is about 0.1 um to about 2.5 um. Preferably the height of the microlenses is thinner and is less than about 0.5 um in fabrication of System-on-Chip (SoC) integrated circuits. For example, a chip comprises an image sensing portion and a logic portion such as a Central Processing Unit (CPU) or a Digital Signal Processor (DSP), the image sensing portion having a plurality of photo-sensitive devices formed thereon and the logic portion having at least four metal interconnection layers. The at least four metal interconnection layers in turn increase the focal length, which requires a thinner microlens. In chips with less metal interconnection layers, the height of the microlenses can be about 0.5 um to about 2.5 um.

Thereafter, standard processes may be used to complete fabrication of the wafer 100 and to dice the wafer 100 into individual dies in preparation to be packaged.

Although the present invention and its advantages have been described in detail, it should be understood that various changes, substitutions and alterations can be made herein without departing from the spirit and scope of the invention as defined by the appended claims. For example, different types of materials and processes may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming one or more microlenses, the method comprising:
    providing a substrate, the substrate having one or more photo-sensitive elements;
    forming a photo-sensitive layer over the substrate;
    performing a first exposure in accordance with a mask;
    performing a second exposure in accordance with the mask;
    removing a portion of the photo-sensitive layer such that remaining portions of the photo-sensitive layer form the one or more microlenses, wherein a total exposure of a first exposed portion of the photo-sensitive layer is less than a total exposure of a second exposed portion such that the removing removes less from the first exposed portion than the second exposed portion; and
    reflowing the microlenses.

2. The method of claim 1, wherein the photo-sensitive layer comprises a positive photoresist material.

3. The method of claim 1, wherein the reflowing the microlenses comprises performing a thermal process at a temperature between about 100° C. and about 200° C. for a time between about 10 seconds to about 30 minutes.

4. The method of claim 1, wherein the photo-sensitive layer has a thickness between about 0.1 um and about 2.5 um.

5. The method of claim 1, wherein the substrate includes four or more interconnection layers.

6. The method of claim 1, wherein a gap between microlenses is less than about 0.2 um.

7. The method of claim 1, wherein a gap between microlenses is less than about 0.1 um.

8. The method of claim 1, wherein the photo-sensitive element is a CMOS image sensor.

9. The method of claim 1, wherein the photo-sensitive element is a CCD.

10. The method of claim 1, further comprising performing a bleaching process prior to the reflowing.

11. A method of forming a plurality of microlenses, the method comprising:
   providing a substrate, the substrate having one or more photo-sensitive elements;
   forming a photo-sensitive layer over the substrate;
   performing a plurality of exposures in accordance with a mask, the exposures exposing at least a portion of the photo-sensitive layer, the performing resulting in a first exposed portion of the photo-sensitive layer from being exposed less than a second exposed portion;
   removing at least a portion of the photo-sensitive layer such that remaining portions of the photo-sensitive layer form the plurality of microlenses; and
   reflowing the plurality of microlenses.

12. The method of claim 11, wherein at least one of the plurality of exposures utilizes a first focal length and at least one of the plurality of exposures utilizes a second focal length, the first focal length being different than the second focal length.

13. The method of claim 11, wherein an energy level used in performing the plurality of exposures is about 0.7 to about 1.0 times E divided by a number of exposures to be performed, wherein E represents an energy level required to pattern the microlenses in a single exposure.

14. The method of claim 11, wherein the microlenses have a height less than about 0.5 um.

15. The method of claim 11, wherein a gap between the microlenses is less than about 0.2 um.

16. The method of claim 11, wherein a gap between the microlenses is less than about 0.1 um.

17. A method of forming an image sensing semiconductor device, the method comprising:
   providing a substrate, the substrate having an image sensing portion and a logic portion, the image sensing portion having a plurality of photo-sensitive devices formed thereon and the logic portion having one or more interconnection layers;
   forming a photo-sensitive layer over the image sensing portion;
   performing a plurality of exposures in accordance with a mask, the exposures exposing at least a portion of the photo-sensitive layer;
   removing at least a portion of the photo-sensitive layer exposed during the exposures, remaining portions of the photo-sensitive layer forming one or more microlenses, the removing including removing only an upper portion of part of the photo-sensitive layer; and
   reflowing the microlenses.

18. The method of claim 17, wherein an energy level used in performing the plurality of exposures is about 0.7 to about 1.0 times E divided by a number of exposures to be performed, wherein E represents an energy level required to pattern the microlenses in a single exposure.

19. The method of claim 17, wherein the microlenses have a height less than about 0.5 um.

20. The method of claim 17, wherein a gap between the microlenses is less than about 0.2 um.

21. The method of claim 17, wherein a gap between the microlenses is less than about 0.1 um.

22. The method of claim 17, wherein the logic portion includes more than about 4 interconnection layers.

* * * * *